April 6, 1954 G. I. HOLMES 2,674,641

THERMOELECTRIC GENERATOR AND METHOD FOR PRODUCTION OF SAME

Filed April 25, 1950

INVENTOR.

Gifford I. Holmes,

BY

Brown, Jackson, Boettcher & Dienner attys.

Patented Apr. 6, 1954 2,674,641

UNITED STATES PATENT OFFICE 2,674,641

THERMOELECTRIC GENERATOR AND METHOD FOR PRODUCTION OF SAME

Gifford I. Holmes, Waukesha, Wis., assignor to Milwaukee Gas Specialty Company, Milwaukee, Wis., a corporation of Wisconsin Application April 25, 1950, Serial No. 157,902

4 Claims. (Cl. 136—5)

This invention relates. in general, to a thermoelectric generator and method for production of same, and has particular relation to a thermoelectric generator in the form of a thermopile comprising a plurality of thermocouples connected in series, and a method for the production of such a thermoelectric generator.

In prior practice it has been customary to form and join the dissimilar elements of thermoelectric generators individually to form the thermoelectric junctions. Such prior practice is not as rapid and economical as may be desired for the production of thermoelectric generators for some purposes. This is particularly so where the thermoelectric generator is in the form of a thermopile having a multiplicity of dissimilar thermoelectric generator elements and a multiplicity of junctions between such elements.

One of the main objects of the present invention is to provide an improved method of producing thermoelectric generators, and, more particularly to provide an improved method for the production of thermoelectric generators in the form of thermopiles more rapidly and economically.

Another object of the invention is to eliminate the necessity for forming and joining the thermoelectric generator elements individually to form the thermoelectric generators and the thermoelectric junctions therefor.

Another object of the invention is to provide a thermoelectric generator of helical form comprising alternate thermoelectric generator elements formed of dissimilar thermoelectric materials and having contiguous ends joined together within the path of the helix to form thermoelectric junctions.

Another object of the invention is to provide a thermoelectric generator with an improved form of partition or barrier between the junctions thereof.

Other objects and advantages, and numerous adaptations of the invention will be apparent from the following detailed description and the accompanying drawing.

Figure 1:
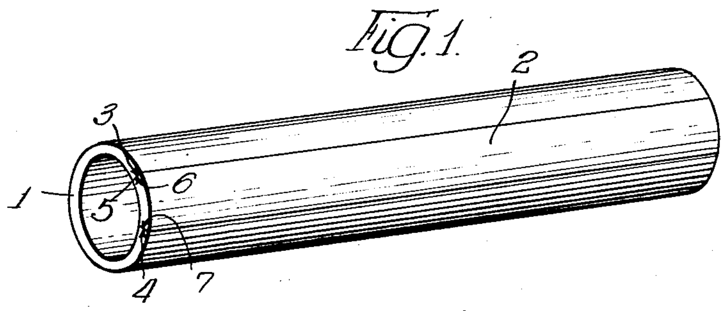
Figure 1 is a fragmentary perspective view showing thermoelectric generator element forming members formed and joined according to the present invention prior to cutting such members helically across the joints into a thermoelectric generator according to the present invention.

Referring now to the drawing, and particularly to Figures 1 through 4, the present invention employs a first thermoelectric generator element forming member 1 and a second thermoelectric generator element forming member 2 in the production of the thermoelectric generator.

The member 1 is shown of generally channel-like cross-section, and, more particularly, of generally tubular form with spaced longitudinal edges 3 and 4 defining a longitudinally extending slot 5 which is shown extending from end-to-end of the member 1. The member 1 may be of generally polygonal or other trough or channel-like form in cross section within the scope of the broader aspects of the present invention.

The first step according to the present invention is to place the second thermoelectric generator element forming member 2 in the slot 5 in member 1, with its opposite longitudinal edges 6 and 7 contiguous to the longitudinal edges 3 and 4 respectively of the member 1. The members 1 and 2 are then joined together along the contiguous edges 3, 6, and 4, 7. The joining of the contiguous edges 3, 6 and 4, 7 together may be accomplished by welding the edges of the members 1 and 2 together. The use of members 1 and 2, which are adapted later to be cut into the form of the thermoelectric generator, enables welding of joining the edges of these members, for example, with an automatic welding mechanism adapted to form continuous welds along the contiguous edges of members 1 and 2. This expedites production, and it reduces the cost of production.

In forming the member 1 the present invention contemplates starting with a tube of the desired thermoelectric material and slotting the same longitudinally to form the longitudinally extending slot or opening 5, or starting with flat stock and rolling or otherwise forming it to the desired cross-sectional configuration with the longitudinal edges 3 and 4 spaced to form the slot or opening 5.

The members 1 and 2 may be formed of any suitable or preferred dissimilar thermoelectric materials. The member 1 may, for example, be formed of stainless steel, copel, constantan, chromel, or any other metal in the thermoelectric series well known in the art, and the member 2 may be formed of the opposite or dissimilar metal separated in the thermoelectric series from the metal from which the member 1 is formed. While dissimilar metals in the thermoelectric series are referred to, it is to be understood that the present invention is not, in its broader aspects, limited to use of thermoelectric generator element forming members made of dissimilar metals, or to the particular dissimilar metals referred to herein. The members 1 and 2 may be formed from other dissimilar metals or alloys, or of other dissimilar thermoelectric materials which, when joined together and heated at the hot junction or junctions, will produce thermoelectric current. The appended claims are to be construed accordingly.

Figure 2:
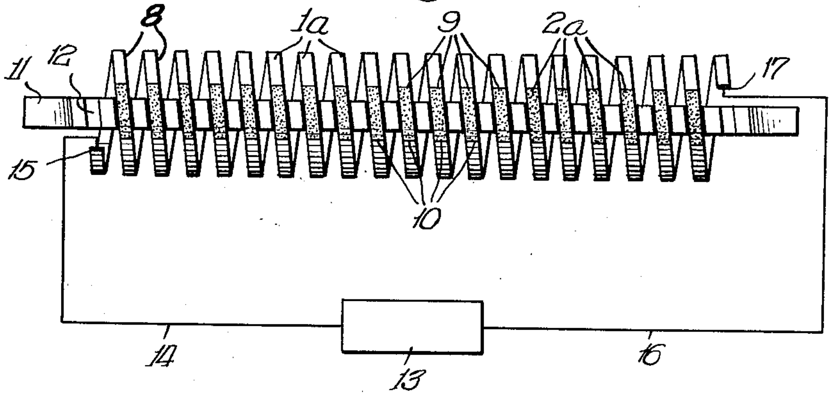
Figure 2 shows the thermoelectric generator produced after cutting the joined members of Figure 1 helically, and one illustrative circuit therefor.
Figure 3:
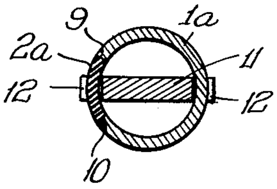
Figure 3 is a transverse sectional view of Figure 2.
Figure 4:
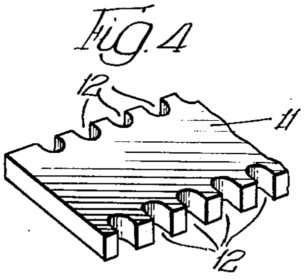
Figure 4 is a fragmentary perspective view of the insulating barrier for separating the junctions between contiguous ends of the thermoelectric generator elements.

After joining the thermoelectric generator element forming members 1 and 2 together as previously described, the next step according to the present invention is to cut the joined members helically at 8 and across the joints into a thermoelectric generator of helical form having dissimilar thermoelectric generator elements 1a and 2a, with contiguous ends thereof joined together within the path of the helix to form thermoelectric junctions 9 and 10 shown in Figures 2 and 3. The helix may be expanded longitudinally after cutting the same to separate the convolutions as shown in Figure 2, or the desired separation of the convolutions may be obtained by making the width of the helical cut sufficient to provide any desired separation. The foregoing is merely illustrative, it being understood that the convolutions of the helix may be separated otherwise as desired.

It will be noted that the junctions 9 and 10 of the resulting thermoelectric generator are formed by the simple expedient of cutting across the contiguous edges 3, 6 and 4, 7 in cutting the members 1 and 2 into helical form. This eliminates the necessity for forming and joining the thermoelectric generator elements 1a and 2a individually to form the thermoelectric generator and the thermoelectric junctions therefor. Accordingly, thermoelectric generators in the form of thermopiles with a multiplicity of thermoelectric generator elements and junctions may be formed rapidly and economically. It is to be understood, however, that the number of elements of which the thermoelectric generator is composed and the number of junctions therefor may vary widely within the scope of the present invention.

While the present invention contemplates use of the helical thermoelectric generator without barrier or separator means between the junctions 9 and 10 where such separator or barrier means is desired, it may, for example, be in the form of a flat partition or barrier 11 formed of suitable thermoelectric insulating material. Natural or synthetic mica, ceramic material, ebonite, Bakelite, fiber board and the like are illustrative of suitable insulating materials from which the partition or barrier 11 may be formed. These materials are merely illustrative, it being understood that other suitable insulating materials are contemplated within the scope of the present invention.

The partition or barrier 11 has a series of notches or indentations 12 along opposite longitudinal edges thereof. The notches 12 along one edge of member 11 are staggered relative to the notches along the opposite edge of this member so that, by engaging the notches 12 at one end of member 11 with the convolution at one end of the helical thermoelectric generator, the partition or barrier 11 may be screwed into the position shown in Figures 2 and 3, with the portions of the partition 11 between notches 12 engaging between the convolutions of the helix. In this position the member 11 forms a barrier or separator between the junctions 9 and the junctions 10. As a result, the junctions 9 or the junctions 10 may be subjected to the heat for energizing the thermoelectric generator without heating the other junctions which may constitute the cold junctions.

Upon completion of the thermoelectric generator, it may be used wherever it is desired to produce a thermoelectric current when, for example, the junctions 9 or the junctions 10 are heated or brought to a predetermined temperature.

In Figure 2, the device indicated diagrammatically at 13 may be a thermoelectric shut-off valve having an electromagnet provided with a coil which, when energized, holds a safety shut-off valve in open position as shown and described in Oscar J. Leins Patent No. 2,126,564, patented August 9, 1938; or the device 13 may be a thermoelectric switch of the type shown and described in Clarence Wantz Patent No. 2,190,303, patented February 13, 1940; or a bleed control for a diaphragm valve of the type shown and described in Wunsch and Schuppert Patent No. 2,291,567, patented July 28, 1942; or a control device of the type shown and described in Lourdes V. McCarty Patent No. 2,349,443, patented May 23, 1944; or the bucking coil of a control device of the type shown and described in Thornbery and Wetzel Patent No. 2,340,234, patented January 25, 1944; or any other suitable device for energization by the thermoelectric generator.

One side of the device 13 is connected by a conductor 14 to one of the cold junctions 15 of the thermoelectric generator, and the other side of the device 13 is connected by a conductor 16 to the other cold junction 17 of the thermoelectric generator.

Where the device 13 is a bucking relay or coil, it may be used, for example, as a limit control for closing a valve or opening a switch when the temperature to which the hot junctions rises to the limit at which, for example, the flow of fuel to a burner is to be shut off.

Figure 5:
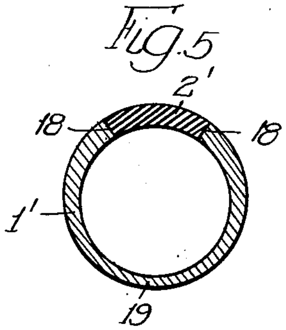
Figure 5 is a transverse sectional view similar to Figure 3 but showing different thicknesses for the walls of the thermoelectric generator elements.

As shown in Figure 5, the present invention contemplates making the thermoelectric generator forming element 1′, or a portion thereof, of weight and thickness different from the weight and thickness of the thermoelectric generator element forming member 2′ to provide for the most favorable heat transfer. In Figure 5 the member 2′ is of the greater weight and thickness, and the member 1′ has ends or edges 18 of substantially the same thickness as the contiguous edges of the member 2′. The member 1′ diminishes to reduced thickness at 19 between the ends 18 thereof. In the case of a member 1′ of generally tubular form, the gradual reduction in thickness of the member to the intermediate portion of reduced thickness may be accomplished, for example, by ball rolling or otherwise forming the member 1′ to the desired sectional configuration.

An important feature of this modification resulting from such construction resides in the fact that some thermocouple metals usually have one metal of high thermal and electrical resistance, while the other metal is usually a better thermal and electrical conductor. Accordingly, if the member 1' is a good conductor and the member 2' a poor conductor, the heavier cross section of the member 2' can be balanced electrically and thermally to the lighter cross section of the member 1' so that optimum effective temperature difference can be had between the junctions 18. Of course it is understood that different metals or alloys or other thermoelectric materials may require different proportions.

The embodiments of the invention shown in the drawing are for illustrative purposes only, and it is to be expressly understood that said drawing and the accompanying specification are not to be construed as a definition of the limits or scope of the invention, reference being had to the appended claims for that purpose.

I claim:

1. In a thermoelectric generator, a helix comprising a helical coil having successive solid sections of dissimilar thermoelectric materials joined end to end to complete the helix, joints between the ends of said sections forming successive dissimilar thermoelectric generator junctions, and a member of electrical insulation extending longitudinally through the helix and of a width to engage the inner peripheries of the convolutions of the helix at diametrically opposite positions, said insulating member having notches along its opposite edges forming insulating projections which project between and separate the convolutions of said helix from each other.

2. In a thermoelectric generator, a helix comprising a helical coil having successive solid sections of dissimilar thermoelectric materials joined end to end to complete the helix, joints between the ends of said sections forming successive dissimilar thermoelectric generator junctions, and a member of electrical insulation extending longitudinally through the helix and of a width to engage the inner peripheries of the convolutions of the helix at diametrically opposite positions, said insulating member having notches along its opposite edges forming insulating projections which project between and separate the convolutions of said helix from each other, at least one notched edge of said insulating member being positioned between opposite ends of one group of similar sections of said helix to afford a heat barrier between the thermoelectric generator junctions on one side of said barrier and the thermoelectric generator junctions on the opposite side of said barrier.

3. In a thermoelectric generator, a helix comprising a helical coil having successive solid sections of dissimilar thermoelectric materials joined end to end to complete the helix, joints between the ends of said sections forming successive dissimilar thermoelectric generator junctions, and a member of electrical insulation extending longitudinally through the helix and of a width to engage the inner peripheries of the convolutions of the helix at diametrically opposite positions, said insulating member having notches along its opposite edges forming insulating projections which project between and separate the convolutions of said helix from each other, the thermoelectric materials of successive sections of said helix having different thermal and electrical conductivity for a given cross section and of different cross sections proportioned to balance said sections thermally and electrically.

4. In a thermoelectric generator, a helix comprising a helical coil having successive solid sections of dissimilar thermoelectric materials joined end to end to complete the helix, joints between the ends of said sections forming successive dissimilar thermoelectric generator junctions, and a member of electrical insulation having staggered notches forming insulating projections along its opposite edges and adapted to be screwed into the helix with said insulating projections engaging between and separating the convolutions from each other.

References Cited in the file of this patent

UNITED STATES PATENTS

| Number | Name | Date |
|---|---|---|
| 2,310,026 | Higley | Feb. 2, 1943 |

FOREIGN PATENTS

| Number | Country | Date |
|---|---|---|
| 2,562,696 | Canada | July 31, 1951 |
| 24,968 of 1899 | Great Britain | Nov. 17, 1900 |
| 34,505 | France | Feb. 5, 1929 |